United States Patent
Tseng et al.

(10) Patent No.: US 9,842,833 B2
(45) Date of Patent: Dec. 12, 2017

(54) ELECTROSTATIC DISCHARGE PROTECTION

(71) Applicant: TAIWAN SEMICONDUCTOR MANUFACTURING COMPANY, LTD., Hsinchu (TW)

(72) Inventors: Jen-Chou Tseng, Jhudong Township (TW); Tzu-Heng Chang, New Taipei (TW); Ming-Hsiang Song, Shin-Chu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 792 days.

(21) Appl. No.: 14/253,197

(22) Filed: Apr. 15, 2014

(65) Prior Publication Data

US 2014/0226241 A1    Aug. 14, 2014

Related U.S. Application Data

(63) Continuation of application No. 13/252,396, filed on Oct. 4, 2011, now Pat. No. 8,730,626.

(51) Int. Cl.
*H01L 23/60* (2006.01)
*H01L 27/02* (2006.01)
*H01L 21/822* (2006.01)
*H01L 23/48* (2006.01)

(52) U.S. Cl.
CPC ........ *H01L 27/0292* (2013.01); *H01L 21/822* (2013.01); *H01L 23/60* (2013.01); *H01L 27/0255* (2013.01); *H01L 27/0262* (2013.01); *H01L 27/0266* (2013.01); *H01L 27/0285* (2013.01); *H01L 23/481* (2013.01); *H01L 2924/0002* (2013.01)

(58) Field of Classification Search
CPC . H01L 27/0292; H01L 23/60; H01L 27/0255; H01L 21/822; H01L 27/0285
See application file for complete search history.

(56) References Cited

U.S. PATENT DOCUMENTS 5,270,261 A      12/1993   Bertin et al.
5,574,395 A  *   11/1996   Kusakabe ........... H01L 27/0255
                                                      327/309

(Continued)

*Primary Examiner* — Rexford Barnie
*Assistant Examiner* — Terrence Willoughby
(74) *Attorney, Agent, or Firm* — Hauptman Ham, LLP

(57) ABSTRACT

A chip includes a first die, a second die, a first and a second through-silicon vias, a first protection circuit, and a second protection circuit. The first die has a first operational voltage node and a first reference voltage node. The second die has a second operational voltage node and a second reference voltage node. The first and the second through-silicon vias are configured to couple the first die and the second die. The first protection circuit is coupled between the first operational voltage node and the first through-silicon via. The second protection circuit is coupled between the first reference voltage node and the second through-silicon via. The first through-silicon via is further coupled to the second reference voltage node or the second operational voltage node. The second through-silicon via is further coupled to the first reference voltage node or the first operational voltage node.

20 Claims, 16 Drawing Sheets

(56) References Cited

U.S. PATENT DOCUMENTS

| | | | | |
|---|---|---|---|---|
| 5,703,747 | A * | 12/1997 | Voldman | H01L 23/5286 |
| | | | | 257/E23.153 |
| 5,930,098 | A | 7/1999 | Voldman et al. | |
| 7,561,390 | B2 * | 7/2009 | Furuta | H01L 23/50 |
| | | | | 361/111 |
| 2005/0030688 | A1 * | 2/2005 | Sakihama | H01L 27/0285 |
| | | | | 361/91.1 |
| 2009/0283898 | A1 * | 11/2009 | Janzen | H01L 21/76898 |
| | | | | 257/698 |
| 2010/0059869 | A1 * | 3/2010 | Kaskoun | H01L 21/76898 |
| | | | | 257/665 |
| 2010/0103573 | A1 | 4/2010 | Sasaki | |

* cited by examiner

ELECTROSTATIC DISCHARGE PROTECTION

PRIORITY CLAIM

The present application is a continuation of U.S. application Ser. No. 13/252,396, filed Oct. 4, 2011, which is incorporated by reference herein in its entirety.

FIELD

The present disclosure is related to electrostatic discharge (ESD) protection for an integrated circuit (IC).

BACKGROUND

A three-dimensional integrated circuit (3D IC) refers to a 3D IC chip (or package) in which two or more dies are vertically integrated into a single chip. A 2.5D IC chip refers to a chip in which two or more dies are horizontally integrated into a single chip. Generally, each circuit of the 2.5/3D IC is a single die and comprises its own function in the conventional X- and Y-dimensions. The horizontal and vertical integration of the two distinct dies constitutes the 2.5 dimension and the third dimension.

In some approaches of 2.5D/3D IC circuits, two dies are connected through an interconnect, such as a through silicon via (TSV). When the charge distribution and thus the voltage potentials between the two dies are not balanced, a current is created and flows between the two dies potentially damaging the dies. An ESD event generally results in a very high voltage and causes a charge imbalance. As a result, an ESD current resulting from an ESD event may find a path to flow from the operational voltage node of a first die to the reference voltage node of the second die, for example. Some transistors in the first and/or the second die may accidentally be part of the current path. Consequently, the gate oxide of the transistors may be destroyed by the ESD current.

BRIEF DESCRIPTION OF THE DRAWINGS

The details of one or more embodiments of the disclosure are set forth in the accompanying drawings and the description below. Other features and advantages will be apparent from the description, drawings, and claims.

Like reference symbols in the various drawings indicate like elements.

DETAILED DESCRIPTION

Figure 1:
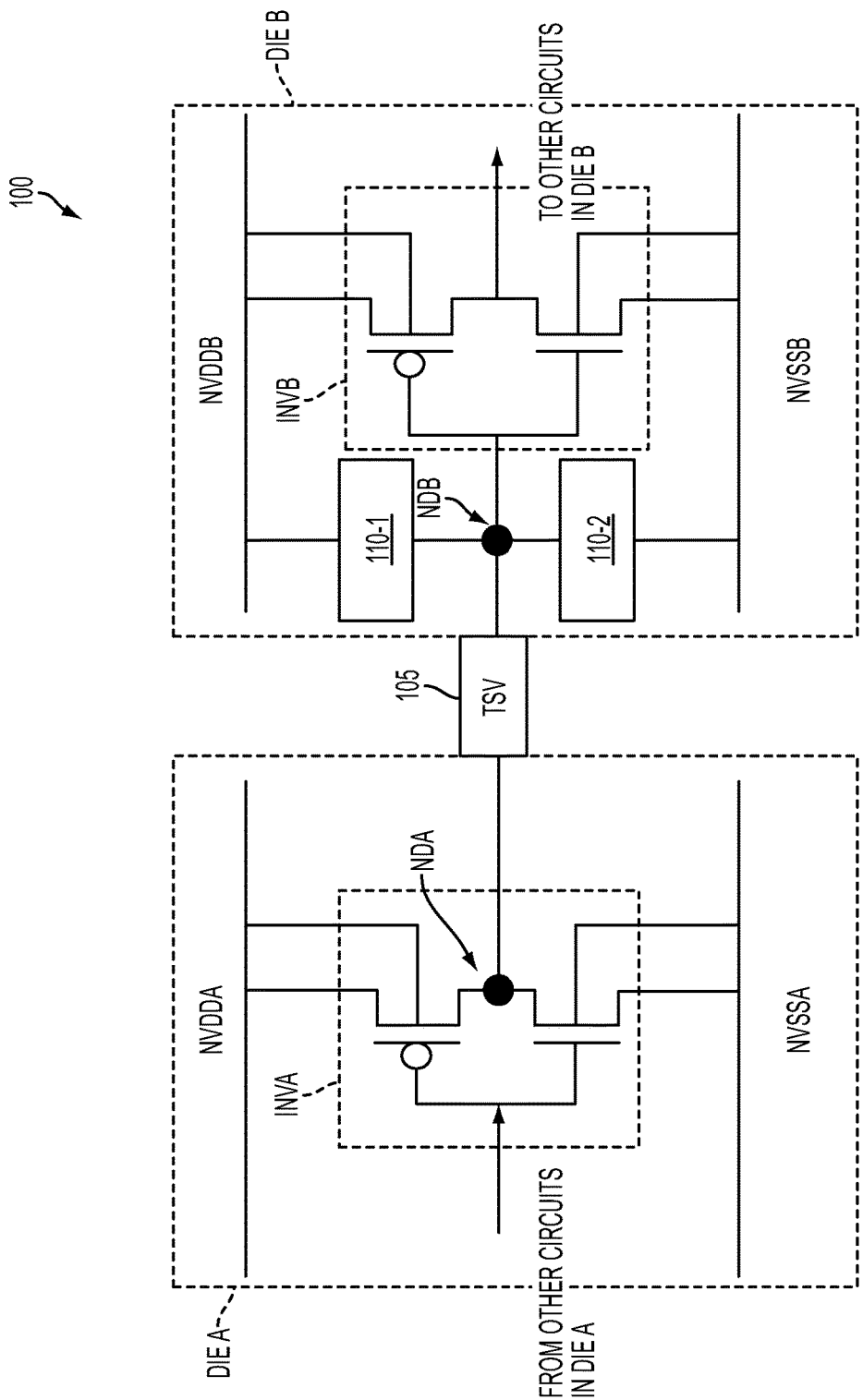
FIG. 1 is diagram of a 3D IC having ESD protection circuits in some locations, in accordance with some embodiments.

Embodiments, or examples, illustrated in the drawings are disclosed below using specific language. It will nevertheless be understood that the embodiments and examples are not intended to be limiting. Any alterations and modifications in the disclosed embodiments, and any further applications of the principles disclosed in this document are contemplated as would normally occur to one of ordinary skill in the pertinent art.

Some embodiments have one or a combination of the following features and/or advantages. ESD protection circuits are used at different locations of two dies in a 2.5D/3D IC chip. Different devices are implemented as the protection circuits, in some embodiments. Exemplary devices include diodes, P and/or N type metal oxide semiconductor (MOS) transistors, silicon controlled rectifiers (SRC), field oxide device (FOD), bipolar junction transistors (BJTs), gate grounded MOS (GGNMOS) transistors, gate and VDD coupled MOS (GDPMOS) transistors, gate-coupled transistors, substrate-triggered transistors, dynamic floating transistors, or other devices. In some embodiments, the ESD protection circuits are formed before the through silicon via (TSV). The ESD protection circuits are configured to provide discharge or current paths for the ESD current to flow. As a result, the large ESD current does not flow through other transistors in the circuits. The ESD protection circuits provide a voltage and current clamp at various odes, in some embodiments. Consequently, the transistors coupled to the nodes are prevented from being subjected to a large voltage and/or a large current. The transistors are therefore protected.

Exemplary Circuits

Various embodiments are explained below in the context of exemplary die A and die B integrated into a single chip.

The chip is manufactured by a 2.5D IC or a 3D IC process that integrates two individual dies, a first individual die and a second individual die on a wafer, and two dies on two separate wafers. The 2.5D process integrates two dies in the horizontal direction while the 3D process integrates two dies in the vertical direction. For simplicity, various embodiments are explained in the context of a 3D IC chip. The inventive concept, however, is applicable to a 2.5D IC chip. In some embodiments, a 2.5D/3D IC chip is a system on chip (SOC) having different circuit functions in die A and die B integrated into a single chip.

Figure 6:
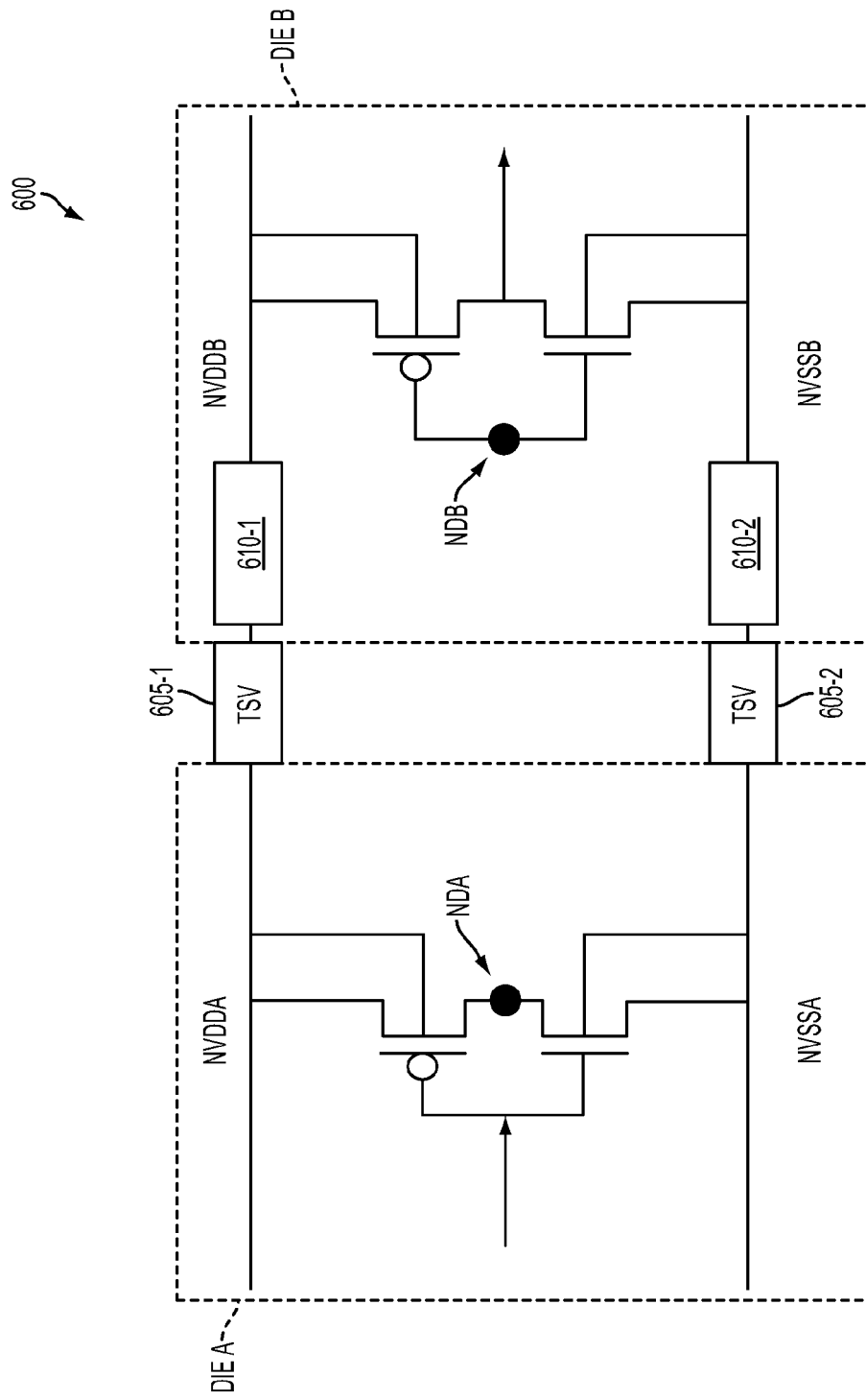
FIG. 6 is a diagram of a circuit having ESD protection circuits in locations differing from the circuit in FIG. 1, in accordance with some embodiments.
Figure 11:
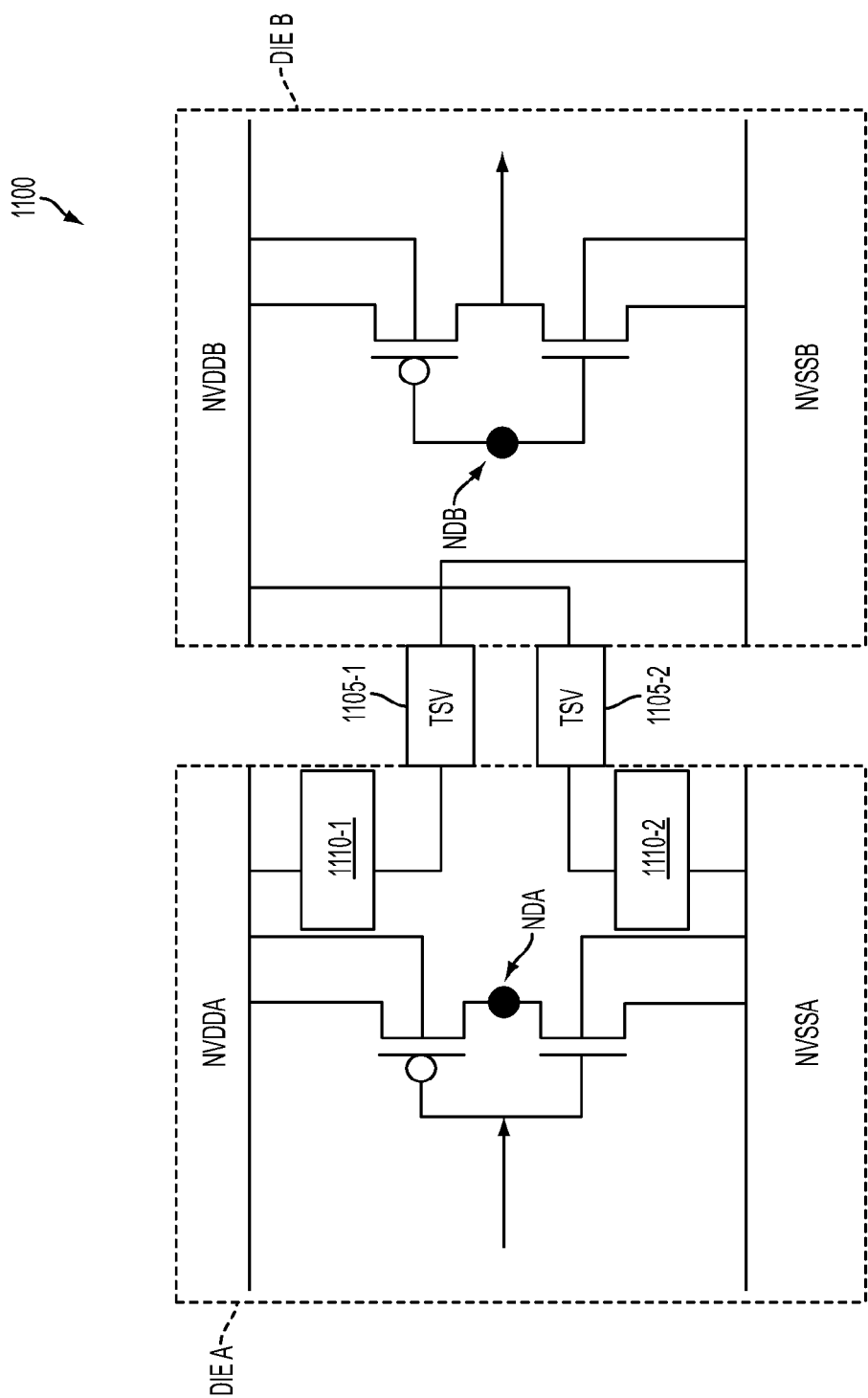
FIG. 11 is a diagram of a circuit having ESD protection circuits in locations differing from the circuit in FIG. 1 and FIG. 6, in accordance with some embodiments.

In the below FIGS. 1, 6, and 11, the protection circuits shown in specific locations are for illustration. A chip having one or a combination of protection circuits at different locations explained in FIGS. 1, 6, and 11 is within the scope of various embodiments. In some embodiments, protection circuits are embedded in the corresponding die before the TVS is formed.

FIG. 1 is a diagram of a 3D IC chip 100, in accordance with some embodiments. Operational voltage node NVDDA in die A has voltage VDDA (not labeled), and operational voltage node NVDDB in die B has voltage VDDB (not labeled). Similarly, reference voltage node NVSSA has voltage VSSA (not labeled) and reference voltage node NVSSB has VSSB (not labeled).

Each of die A and die B has its own circuitry function. Die A comprises an inverter INVA and die B comprises an inverter INVB for illustration. Input of inverter INVA receives signals from other circuits in die A. Output node NDA of inverter A is electrically coupled to input node NDB of inverter INVB by way of a 3D IC connect, such as a through silicon via (TSV) 105. Output of inverter INVB is provided to other circuits in die B. In some embodiments, TSV 105 is formed by a metal layer.

The output of inverter INVB is the result of the input from other circuits in die A passing through two inverters INVA and INVB. As a result, the input of inverter INVA and the output of inverter INVB are electrically the same. Explained in another way, the signals of circuits in die A are transferred to die B.

ESD clamp or protection circuits 110-1 and 110-2 provide current paths for the ESD current to flow when an ESD event occurs. Circuits 110-1 and 110-2 also provide a clamp voltage and a clamp current at node NDB. For illustration, circuit 110-1 is shown coupled between node NDB and node NVDDB of die B. Circuit 110-1 coupled between node NDA and node NVDDA of die A is within the scope of various embodiments. Similarly, circuit 110-2 is shown coupled between node NDB and node NVSSB for illustration. Circuit 110-2 coupled between node NDA and node NVSSA of die A is within the scope of various embodiments. Further, both circuits 110-1 and 110-2 are shown for illustration. One or a combination of circuits 110-1 and 110-2 at different locations is within the scope of various embodiments.

Figure 2:
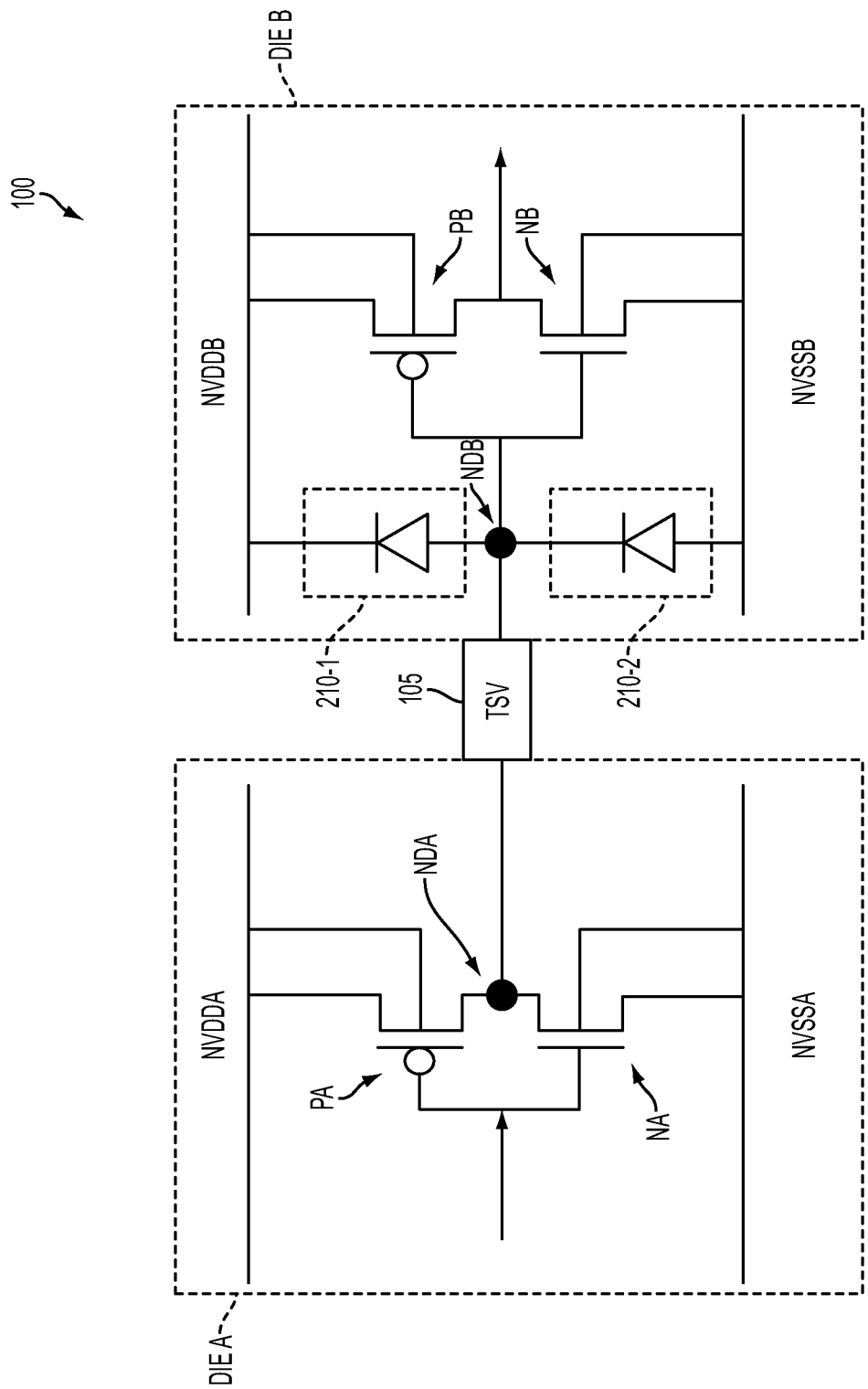
FIG. 2 is a diagram of the circuit in FIG. 1 in which the protection circuits are implemented as diodes, in accordance with some embodiments.

FIG. 2 is a diagram of chip 100 in which circuits 110-1 and 110-2 are implemented by a diode 210-1 and a diode 210-2, respectively. For simplicity, various details of die A and die B are not labeled.

The anode of diode 210-1 is coupled to node NDB while the cathode of diode 210-1 is coupled to node NVDDB. When an ESD event occurs, for example, the ESD current has a path to flow from node NDB through diode 210-1 to node NVDDB. In some embodiments, the ESD current also flows from node NVDDB to node NVSSB through another protection circuit (not shown) between node NVDDB and NVSSB. Similarly, if diode 210-1 is located between node NDA and node NVDDA, the ESD current has a path to flow from node NDB through TSV 105, node NDA, and diode 210-1 to node NVDDA. In some embodiments, the ESD current also flows from node NVDDA to node NVSSA through another protection circuit (not show) between node NVDDA and node NVSSA.

The anode of diode 210-2 is coupled to node NVSSB, and the cathode of diode 210-2 is coupled to node NDB. As a result, when an ESD event occurs, the ESD current has a path to flow from node NVSSB to node NDB. Without diode 210-2, the ESD current may flow from the source to the gate of transistor NB (or node NDB), and damage transistor NB. If diode 210-2 is coupled between node NVSSA and node NDA, the ESD current has a path to flow from node NVSSA and node NDA.

Figure 3:
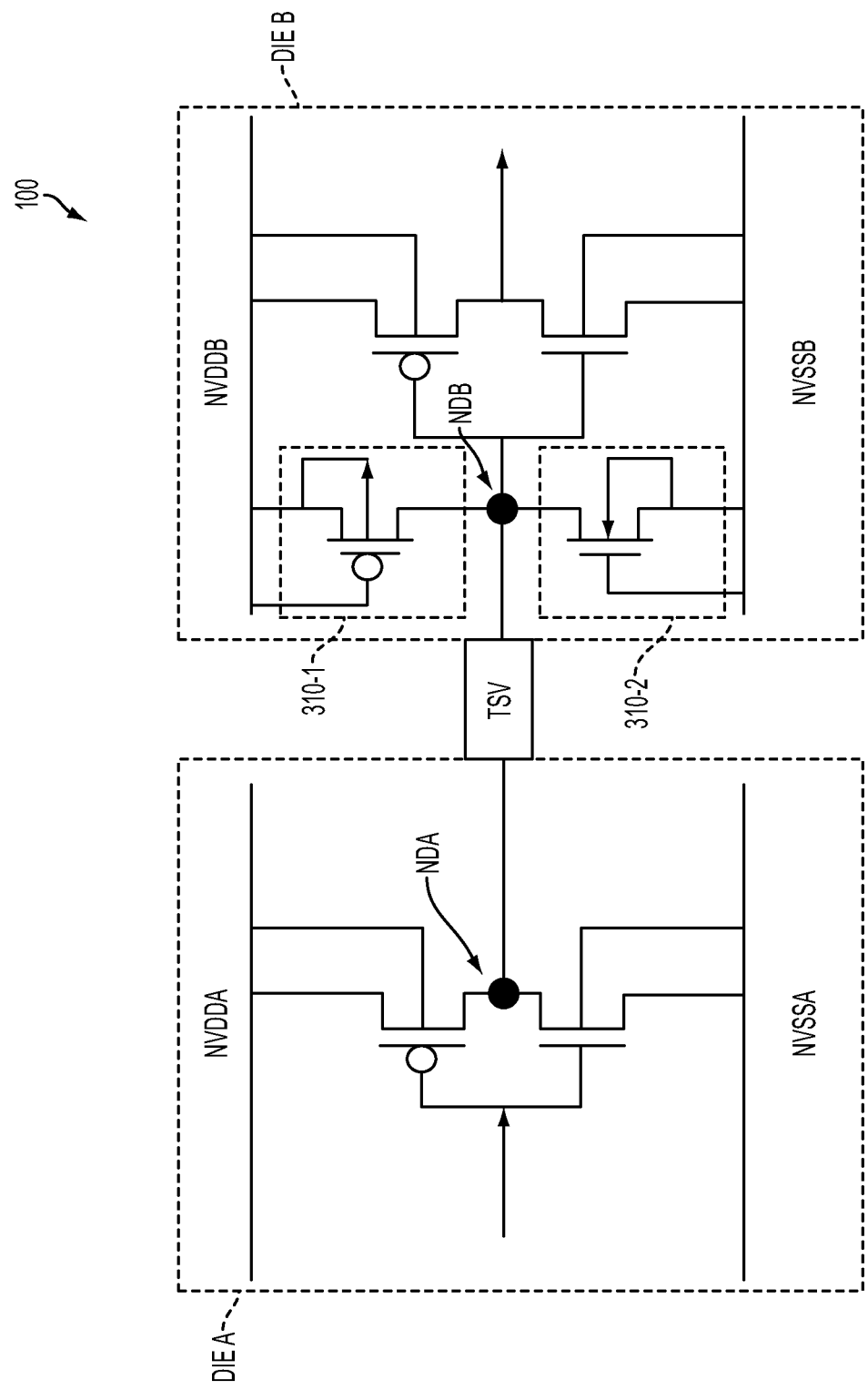
FIG. 3 is a diagram of the circuit in FIG. 1 in which the protection circuits are implemented as metal oxide semiconductor (MOS) transistors, in accordance with some embodiments.

FIG. 3 is a diagram of chip 100 in which circuits 110-1 and 110-2 are implemented by a PMOS transistor 310-1 and an NMOS transistor 310-2, respectively. Transistor 310-1 provides a first current path from node NDB to node NVDDB and a second current path from node NVDDB to node NDB.

PMOS transistor 310-1 is configured as a diode because the source and the gate of PMOS transistor 310-1 are coupled together (and coupled to node NVDDB). As a result, the function of PMOS transistor 310-1 is similar to that of diode 210-1 in FIG. 2. That is, transistor 310-1 provides a first current path from node NDB through transistor 310-1 to node NVDDB by functioning as a diode. In addition, by nature of a PMOS transistor, transistor 310-1 also provides a second current path from the source NVDDB to the drain NDB of transistor 310-1.

Similarly, NMOS transistor 310-2 is configured as a diode because the gate and the source of transistor 310-2 are coupled together (and to node NVSSB). As a result, the function of NMOS transistor 310-2 is similar to that of diode 210-2. Transistor 310-2 thus provides a first current path from node NVSSB through transistor 310-2 to node NVDDB. In addition, transistor 310-2, by nature of an NMOS transistor, also provides a second current path from node NDB through transistor 310-2 to node NVSSB.

Figure 4:
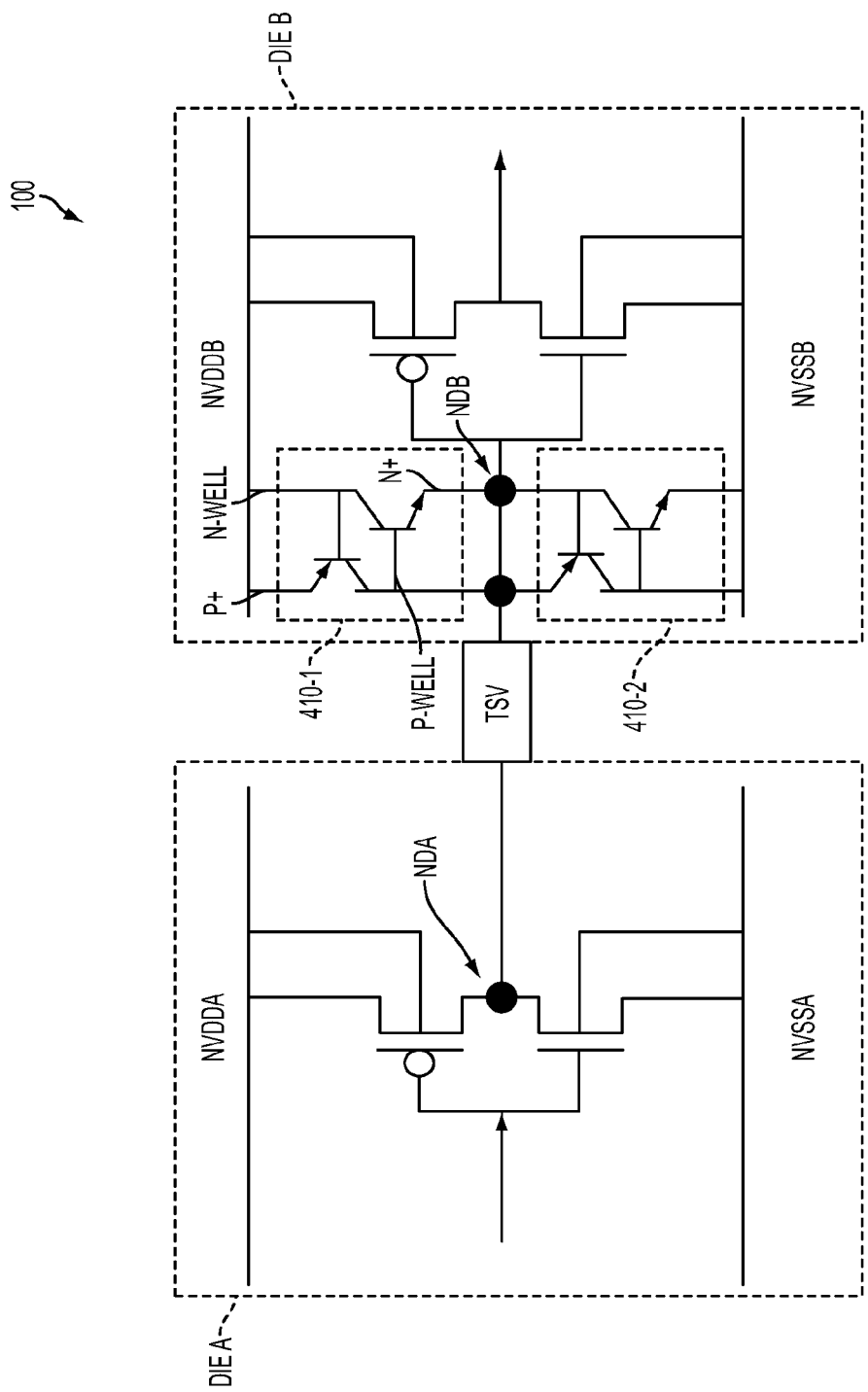
FIG. 4 is a diagram of the circuit in FIG. 1 in which the protection circuits are implemented as silicon control rectifiers (SCRs), in accordance with some embodiments.

FIG. 4 is a diagram of chip 100 in which circuits 110-1 and 110-2 are implemented by silicon control rectifiers (SCRs) 410-1 and 410-2, respectively. In some embodiments, an SCR includes a P+ region, an N-well, a P-well, an N+ region as illustratively shown for SCR 410-1 in FIG. 4. For simplicity, the P+ region, the N-well, the P-well, and the N+ region of SCR 410-2 are not labeled, but should be recognizable by persons of ordinary skill in the art. An SCR allows current to flow through the SCR in both directions. For example, SCR 410-1 provides a first current path from node NDB to node NVDDB through the P-well and the N-well. SCR 410-1 also provides a second current path from node NVDDB to node NDB through the P+ and N+ regions.

Similarly, SCR 410-2 provides a first current path from node NVSSB to node NDB through the P-well and N-well of SCR 410-2. SCR 410-2 also provides a second current path from node NDB to node NVSSB through the P+ and N+ regions of SCR 410-2.

Figure 5:
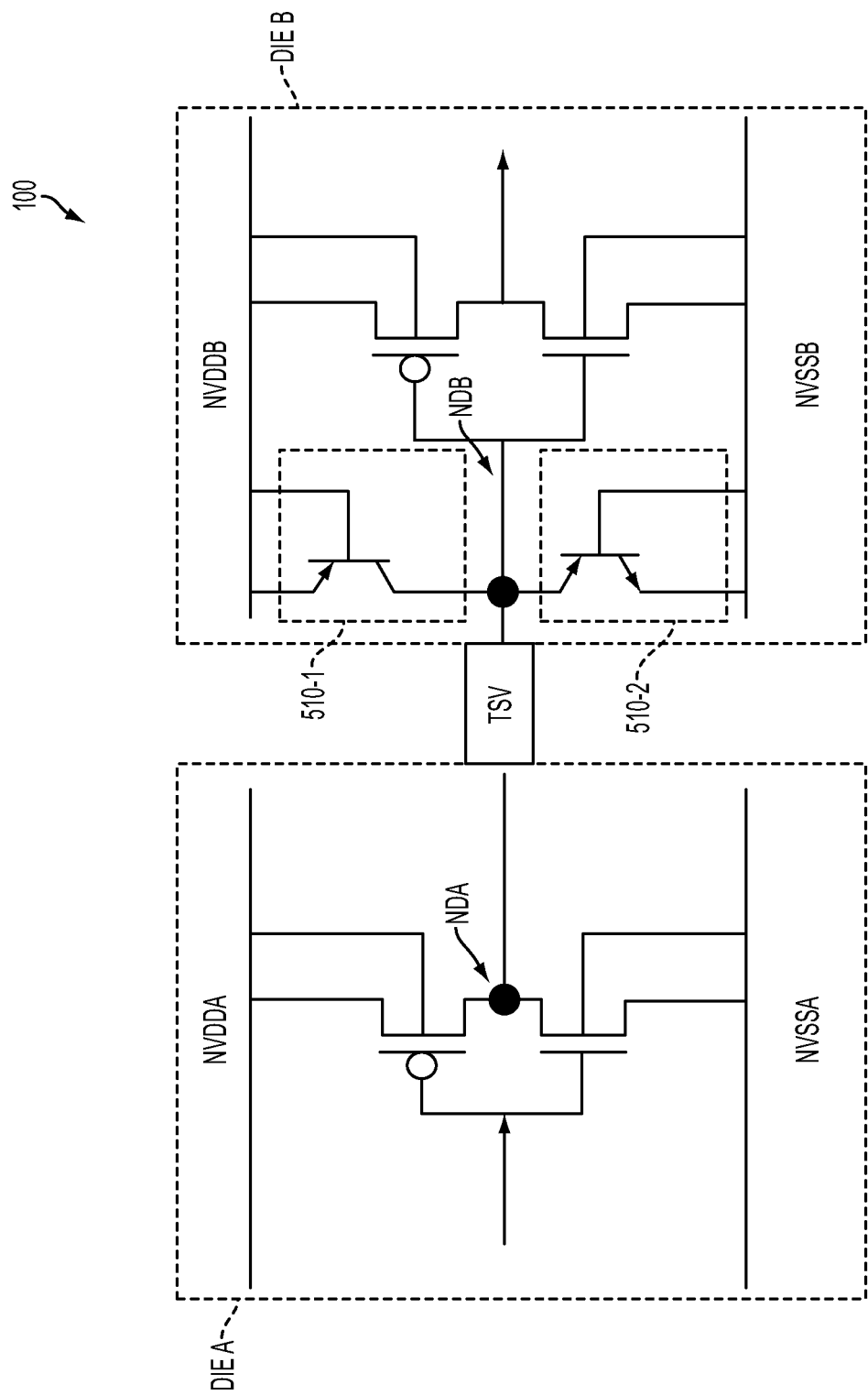
FIG. 5 is a diagram of the circuit in FIG. 1 in which the protection circuits are implemented as bipolar junction transistors (BJTs), in accordance with some embodiments.

FIG. 5 is a diagram of chip 100 in which circuits 110-1 and 110-2 are implemented by bipolar junction transistors (BJTs) 510-1 and 510-2, respectively.

The emitter and the base of PNP transistor 510-1 are coupled together and to node NVDDB. The collector of transistor 510-1 is coupled to node NDB. Transistor 510-1 provides a first current path from node NVDDB to node NDB through the normal function of a PNP transistor. For example, the current flows through the emitter at node NVDDB to the collector at node NDB. Transistor 510-2 also provides a second current path from node NDB to node NVDDB by functioning as a diode formed by the P+ region at the collector or node NDB, and the N-well of the base coupled to node VNDDB.

The emitter and the base of transistor 510-2 are coupled together and to node NVSSB. The collector of transistor 510-2 is coupled to node NDB. Transistor 510-2 provides a first current path from node NDB to node NVSSB through the normal function of an NPN transistor. For example, the current flows through the collector at node NDB to the emitter at node NVSSB. Transistor 510-2 also provides a second current path from node NVSSB to node NDB. In this second situation, transistor 510-2 functions as a diode formed by the P-well of the base at node NVSSB and the N region at the collector coupled to node NDB.

FIG. 6 is a diagram of a 3D IC chip 600, in accordance with some embodiments. ESD protection circuit 610-1 and a first TSV 605-1 are coupled between operational voltage nodes NVDDA and NVDDB. Circuit 610-1 as shown in die B between TSV 605-1 and node NVDDB is for illustration. Circuit 610-1 in die A between node NVDDA and TSV 605-1 is within the scope of various embodiments.

Similarly, circuit 610-2 and a second TSV 605-2 are coupled between reference voltage nodes NVSSA and NVSSB. Circuit 610-2 as shown in die B between TSV 605-2 and node NVSSB is for illustration. Circuit 610-2 in die A between node NVSSA and TSV 605-2 is within the scope of various embodiments.

Figure 7:
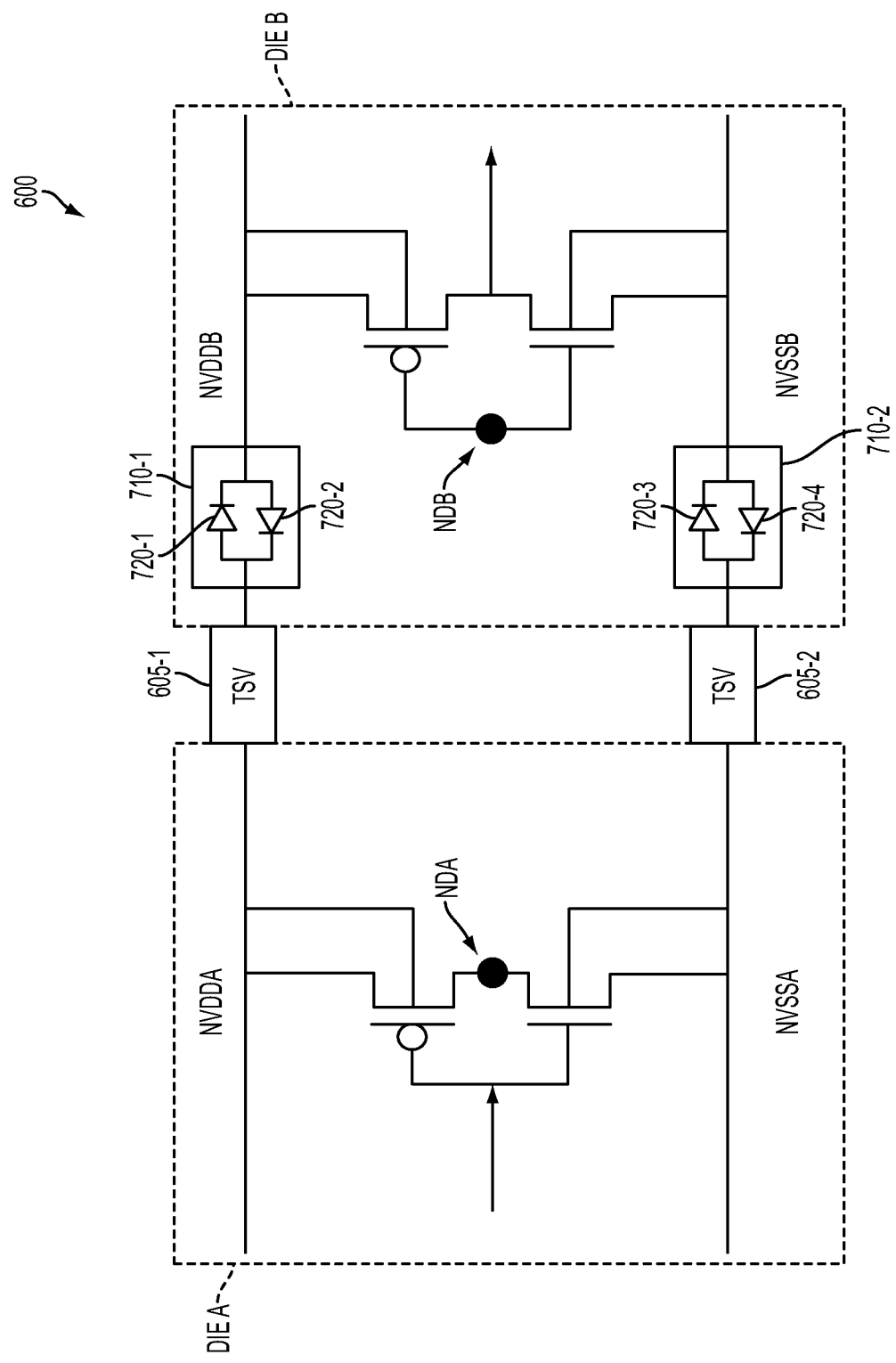
FIG. 7 is a diagram of the circuit in FIG. 6 in which the protection circuits are implemented as pairs of diodes, in accordance with some embodiments.

FIG. 7 is a diagram of chip 600 in which each circuit 610-1 and 610-2 is implemented with a pair of diodes in circuits 710-1 and 710-2, respectively, in accordance with some embodiments. Circuit 710-1 provides a first current path from node NVDDA by way of TSV 605-1 and diode 720-1 to node NVDDB. Circuit 710-1 also provides a second current path from node NVDDB, diode 720-2, and TSV 605-1 to node NVDDA.

Circuit 710-2 provides a first current path from node NVSSA, TSV 605-2, and diode 720-3 to node NVSSB. Circuit 710-2 also provides a second current path from node NVSSB, diode 720-4, and TSV 605-2 to node NVSSA.

Figure 8:
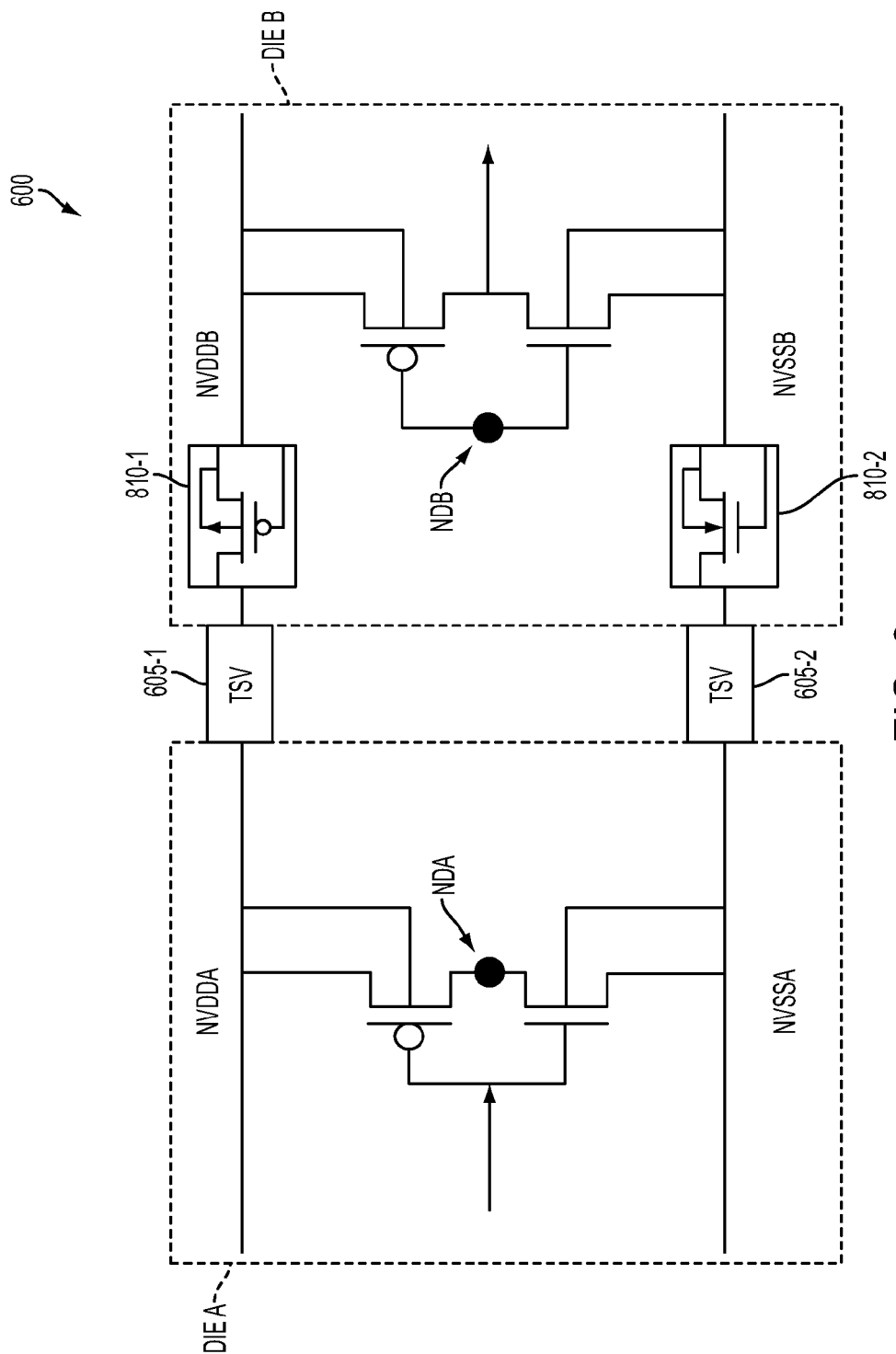
FIG. 8 is a diagram of the circuit in FIG. 6 in which the protection circuits are implemented as MOS transistors, in accordance with some embodiments.

FIG. 8 is a diagram of chip 600 in which circuits 610-1 and 610-2 are implemented with a PMOS transistor 810-1 and an NMOS transistor 810-2, respectively, in accordance with some embodiments. Each of PMOS transistor 810-1 and NMOS transistor 810-2 provides two current paths in opposite directions similar to PMOS transistor 310-1 and NMOS transistor 310-2 in FIG. 3, respectively. In other words, PMOS transistor 810-1 provides a first current path from node NVDDA, TSV 605-1, and transistor 810-1 to node NVDDB. PMOS transistor 810-1 also provides a second current path from node NVDDB, transistor 810-1, and TSV 605-1 to node NVDDA. Similarly, NMOS transistor 810-2 provides a first current path from node NVSSA, TSV 605-2, and transistor 810-2 to node NVSSB. PMOS transistor 810-2 also provides a second current path from node NVSSB, transistor 810-2, and TSV 605-2 to node NVSSA.

Figure 9:
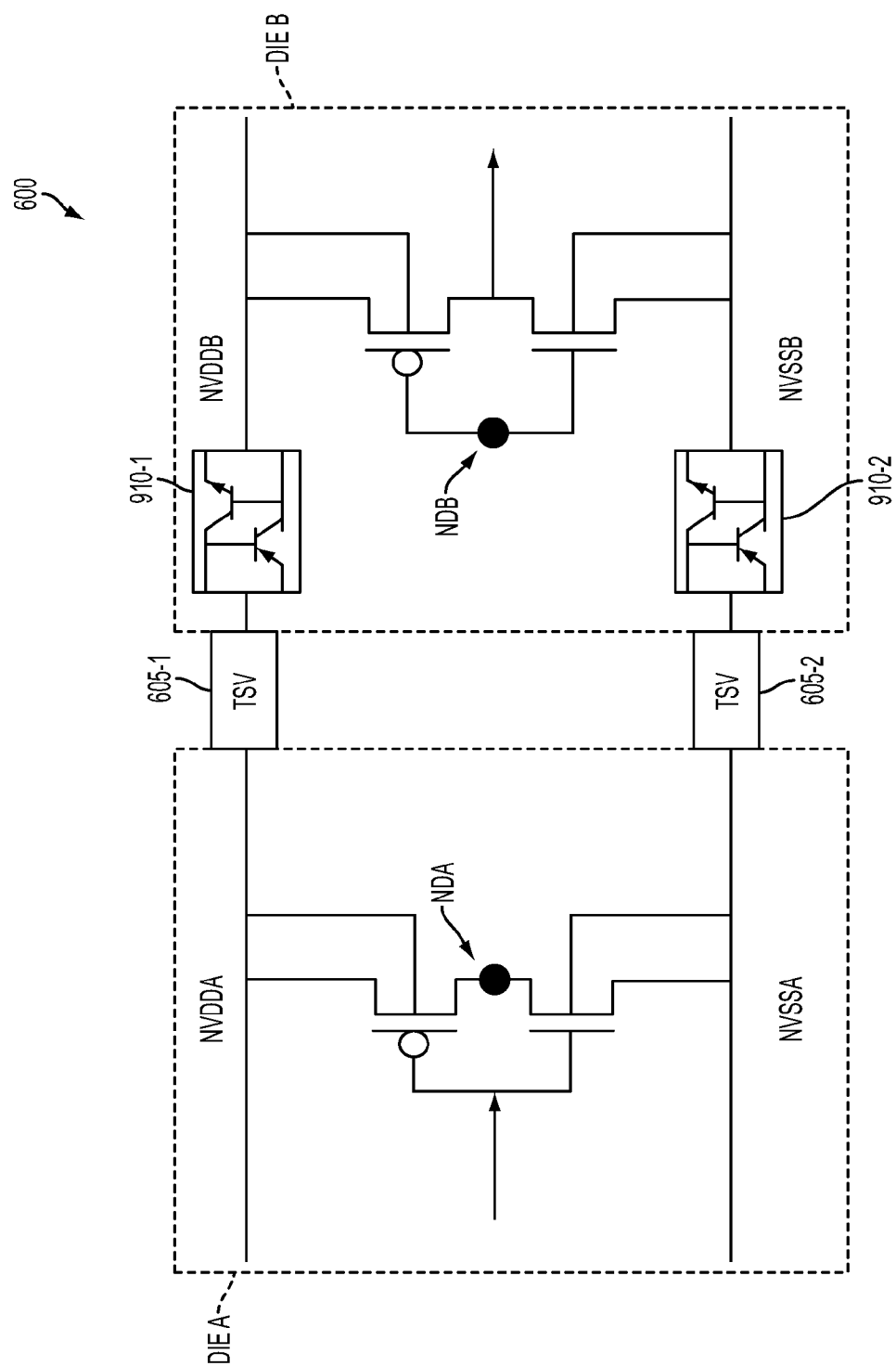
FIG. 9 is a diagram of the circuit in FIG. 6 in which the protection circuits are implemented as SCRs, in accordance with some embodiments.

FIG. 9 is a diagram of chip 600 in which circuits 610-1 and 610-2 are implemented with SCRs 910-1 and 910-2, respectively, in accordance with some embodiments. Each of SCR 910-1 and SCR 910-2 provides two current paths in opposite directions similar to SCR 410-1 and SCR 410-2 in FIG. 4, respectively. In other words, SCR 910-1 provides a first current path from node NVDDA, TSV 605-1, and SCR 910-1 to node NVDDB. SCR 910-1 also provides a second current path from node NVDDB, transistor 910-1, and TSV 605-1 to node NVDDA. Similarly, SCR 910-2 provides a first current path from node NVSSA, TSV 605-2, and SCR 910-2 to node NVSSB. SCR 910-2 also provides a second current path from node NVSSB, SCR 910-2, and TSV 605-2 to node NVSSA.

Figure 10:
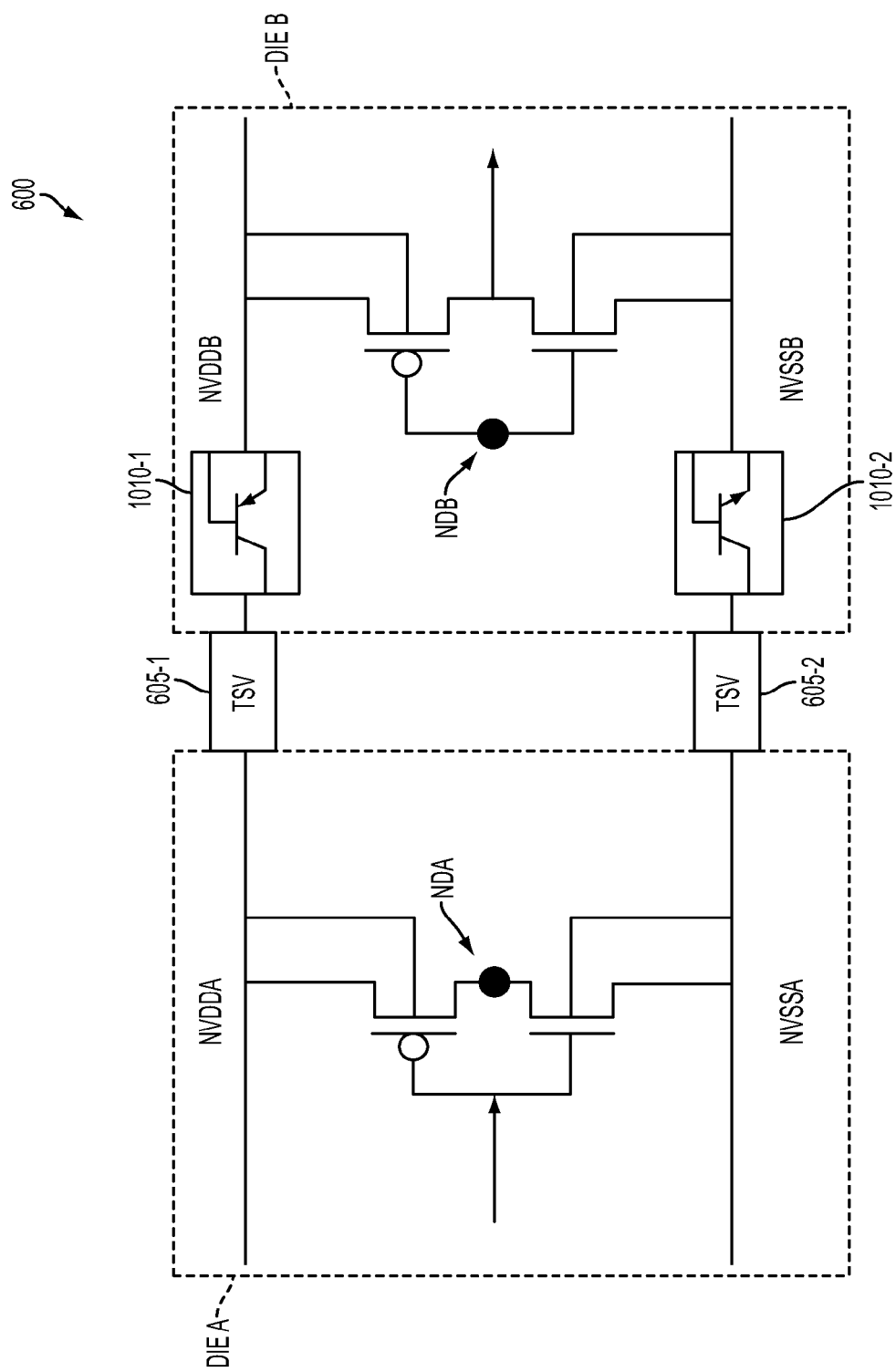
FIG. 10 is a diagram of the circuit in FIG. 6 in which the protection circuits are implemented as BJTs, in accordance with some embodiments.

FIG. 10 is a diagram of chip 600 in which circuits 610-1 and 610-2 are implemented with BJTs 1010-1 and 1010-2, respectively, in accordance with some embodiments. Each of BJT 1010-1 and BJT 1010-2 provides two current paths in opposite directions similar to BJT 510-1 and BJT 510-2 in FIG. 5, respectively. In other words, BJT 1010-1 provides a first current path from node NVDDA, TSV 605-1, and BJT 1010-1 to node NVDDB. BJT 1010-1 also provides a second current path from node NVDDB, BJT 1010-1, and TSV 605-1 to node NVDDA. Similarly, BJT 1010-2 provides a first current path from node NVSSA, TSV 605-2, and BJT 1010-2 to node NVSSB. BJT 1010-2 also provides a second current path from node NVSSB, BJT 1010-2, and TSV 605-2 to node NVSSA.

FIG. 11 is a diagram of a 3D IC chip 1100, in accordance with some embodiments. In some embodiments, ESD protection circuit 1110-1 and a first TSV 1105-1 are coupled between operational voltage node NVDDA of die A and reference voltage node NVSSB of die B. Circuit 1110-1 shown in die A between node NVDDA and TSV 1105-1 is for illustration. Circuit 1110-1 in die B between TSV 1105-1 and node NVSSB is within the scope of various embodiments.

Similarly, in some embodiments, circuit 1110-2 and a second TSV 1105-2 are coupled between reference voltage node NVSSA and operational voltage node NVDDB. Circuit 1110-2 shown in die A between NVSSA and TSV 1105-2 is for illustration. Circuit 1110-2 in die B between TSV 1105-2 and node NVDDB is within the scope of various embodiments.

Figure 12:
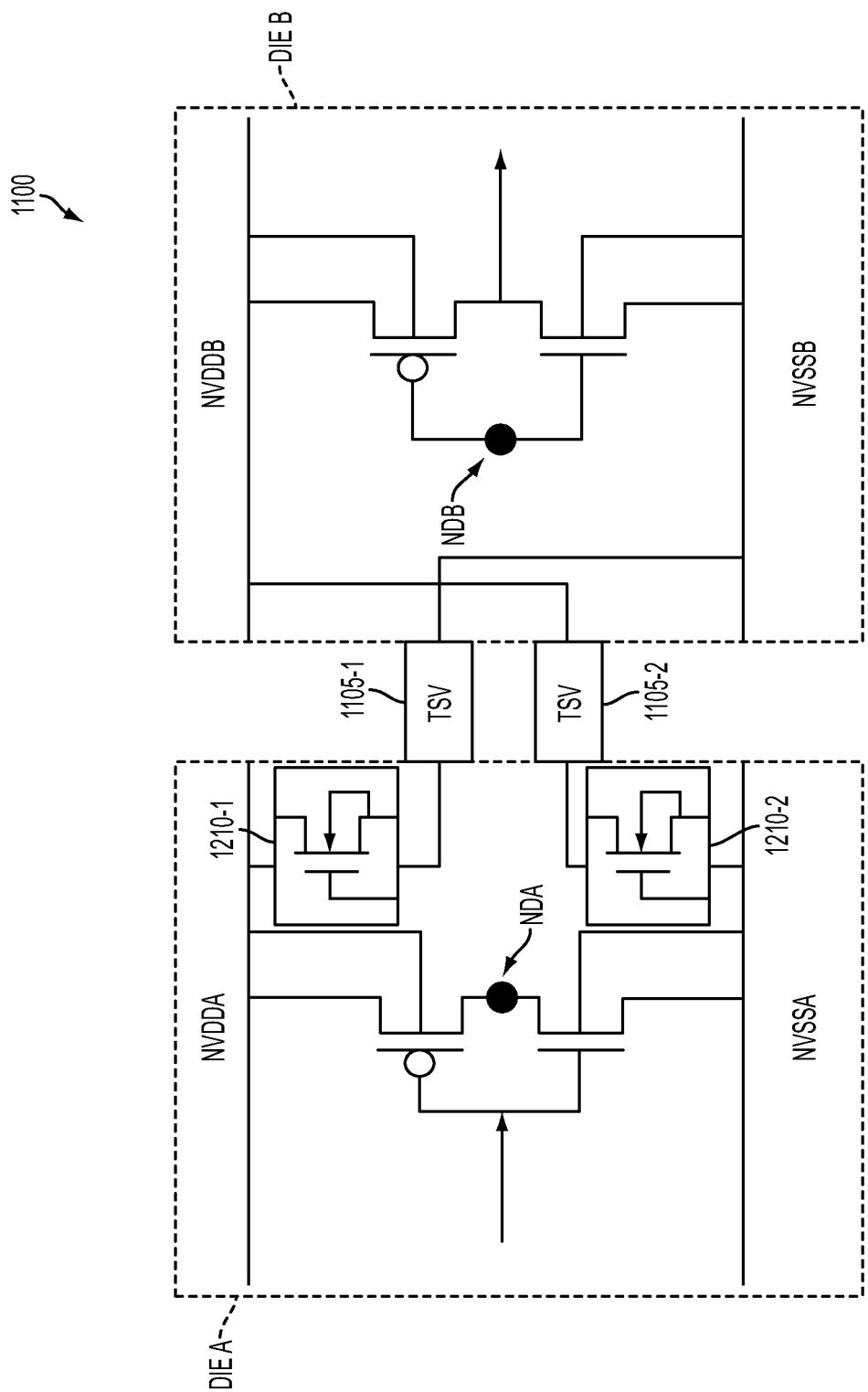
FIG. 12 is a diagram of the circuit in FIG. 11 having protection circuits implemented as N-type metal oxide semiconductor (NMOS) transistors, in accordance with some embodiments.

FIG. 12 is a diagram of chip 1100 in which circuits 1110-1 and 1110-2 are implemented with NMOS transistors 1210-1 and 1210-2, respectively, in accordance with some embodiments.

Each of transistor 1210-1 and transistor 1210-2 provides two current paths in opposite directions similar to NMOS transistor 310-2 in FIG. 3. In other words, NMOS transistor 1210-1 provides a first current path from node NVDDA, transistor 1210-1, and TSV 1105-1 to node NVSSB. Transistor 1210-1 also provides a second current path from node NVSSB, TSV 1105-1, and transistor 1210-1 to node NVDDA.

Similarly, NMOS transistor 1210-2 provides a first current path from node NVSSA, transistor 1210-2, and TSV 1105-2 to node NVDDB. Transistor 1210-2 also provides a second current path from node NVDDB, TSV 1105-2, and transistor 1210-2 to node NVSSA.

Figure 13:
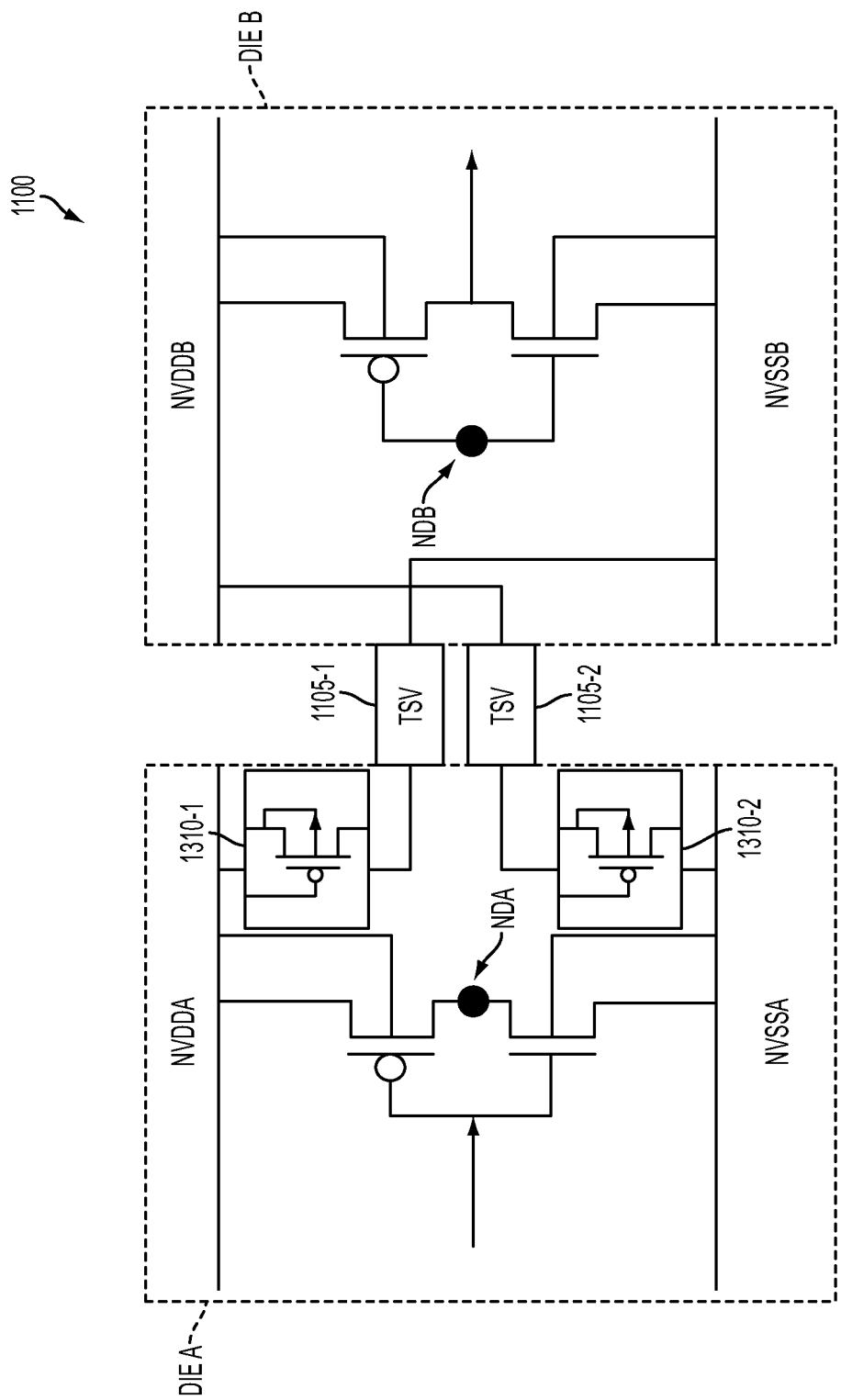
FIG. 13 is a diagram of the circuit in FIG. 11 having protection circuits implemented as P-type metal oxide semiconductor (PMOS) transistors, in accordance with some embodiments.

FIG. 13 is a diagram of chip 1100 in which circuits 1110-1 and 1110-2 are implemented with PMOS transistors 1310-1 and 1310-2, respectively, in accordance with some embodiments.

Each of PMOS transistor 1310-1 and PMOS transistor 1310-2 provides two current paths in opposite directions similar to PMOS transistor 310-1 in FIG. 3. In other words, PMOS transistor 1310-1 provides a first current path from node NVDDA, transistor 1310-1, and TSV 1105-1 to node NVSSB. Transistor 1310-1 also provides a second current path from node NVSSB, TSV 1105-1, and transistor 1310-1 to node NVDDA.

Similarly, PMOS transistor 1310-2 provides a first current path from node NVSSA, transistor 1310-2, and TSV 1105-2 to node NVDDB. Transistor 1310-2 also provides a second current path from node NVDDB, TSV 1105-2, and transistor 1310-2 to node NVSSA.

Figure 14:
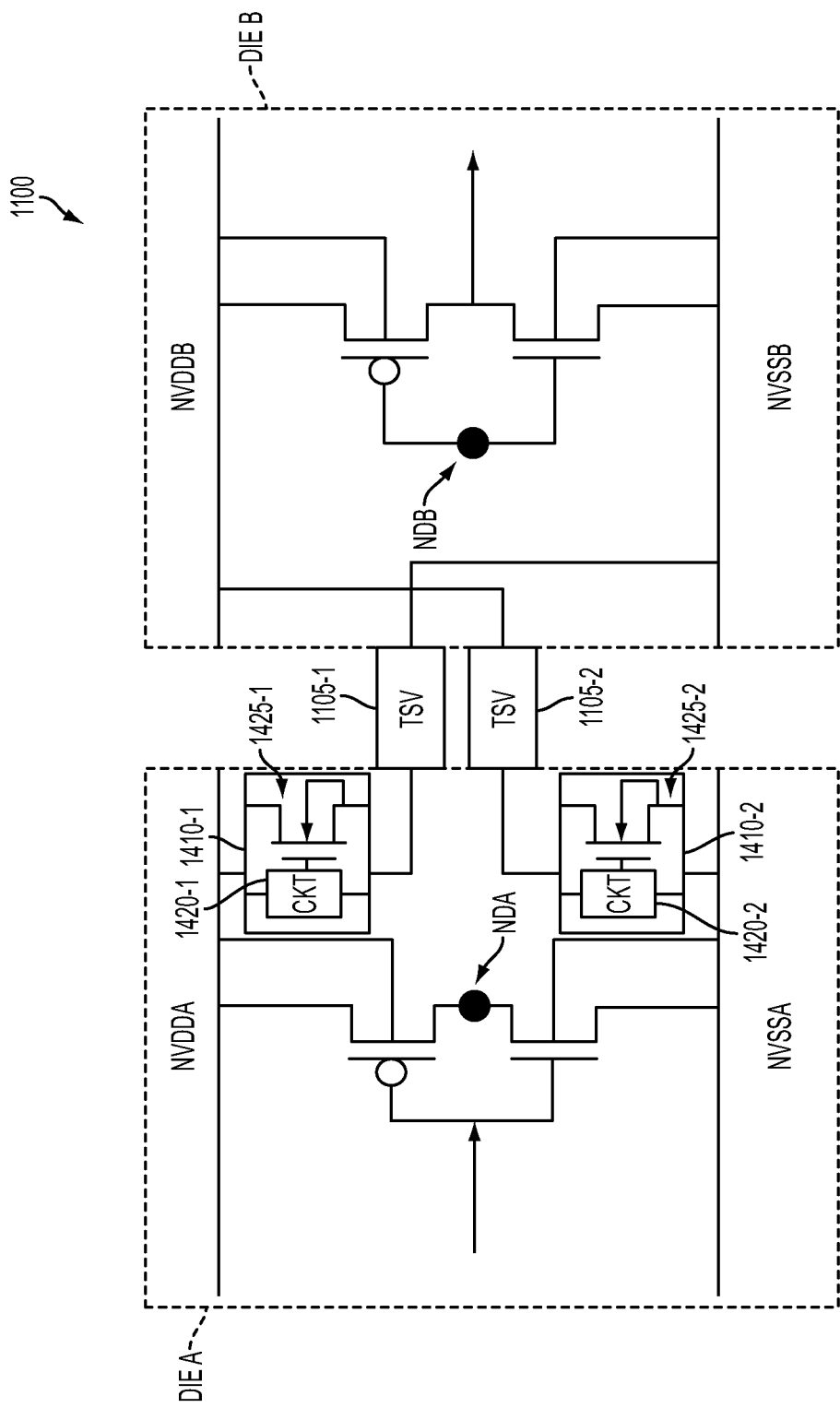
FIG. 14 is a diagram of the circuit in FIG. 11 having protection circuits implemented as NMOS transistors with a control circuit, in accordance with some embodiments.

FIG. 14 is a diagram of chip 1100 in which circuits 1110-1 and 1110-2 are implemented with circuits 1410-1 and 1410-2, respectively, in accordance with some embodiments.

Circuit 1410-1 includes an NMOS transistor 1425-1 having a gate coupled to control circuit 1420-1 to turn on and off transistor 1425-1. Because of the gate-coupled configuration, transistor 1425-1 is commonly called a gate-coupled transistor.

When transistor 1425-1 is off, transistor 1425-1 is electrically disconnected from node NVDDA. As a result, there is no leakage through transistor 1425-1. When transistor 1425-1 is on, however, transistor 1425-1 functions in a manner similar to NMOS transistor 1210-1. That is, NMOS transistor 1425-1 provides a first current path from node NVDDA, transistor 1425-1, and TSV 1105-1 to node NVSSB. Transistor 1425-1 also provides a second current path from node NVSSB, TSV 1105-1, and transistor 1425-1 to node NVDDA.

In various embodiments, in a normal operation of chip 1100, control circuit 1420-1 is configured to turn off transistor 1425-1. When an ESD event occurs, the ESD current and/or ESD voltage causes control circuit 1420-1 to turn on transistor 1425-1. In some embodiments, control circuit 1420-1 includes mechanisms known in the art to turn on and off transistor 1425-1 based on an ESD event. The mechanisms are not described in this document, but should be recognizable by persons of ordinary skill in the art.

Circuit 1410-2 includes an NMOS transistor 1425-2 having a gate coupled to control circuit 1420-2 to turn on and off transistor 1425-2. Because of the gate-coupled configuration, transistor 1425-2 is commonly called a gate-coupled transistor.

When transistor 1425-2 is off, transistor 1425-2 is electrically disconnected from node NVSSA. As a result, there is no leakage through transistor 1425-2. When transistor 1425-2 is on, however, transistor 1425-2 functions in a manner similar to NMOS transistor 1210-2. That is, NMOS transistor 1425-2 provides a first current path from node NVSSA, transistor 1425-2, and TSV 1105-2 to node NVDDB. Transistor 1425-2 also provides a second current path from node NVDDB, TSV 1105-2, and transistor 1425-2 to node NVSSA.

In various embodiments, in a normal operation of chip 1100, control circuit 1420-2 is configured to turn off transistor 1425-2. When an ESD event occurs, the ESD current and/or ESD voltage causes control circuit 1420-2 to turn on transistor 1425-2. In some embodiments, control circuit 1420-2 includes mechanisms known in the art to turn on and off transistor 1425-2 based on an ESD event. The mechanisms are not described in this document, but should be recognizable by persons of ordinary skill in the art.

Figure 15:
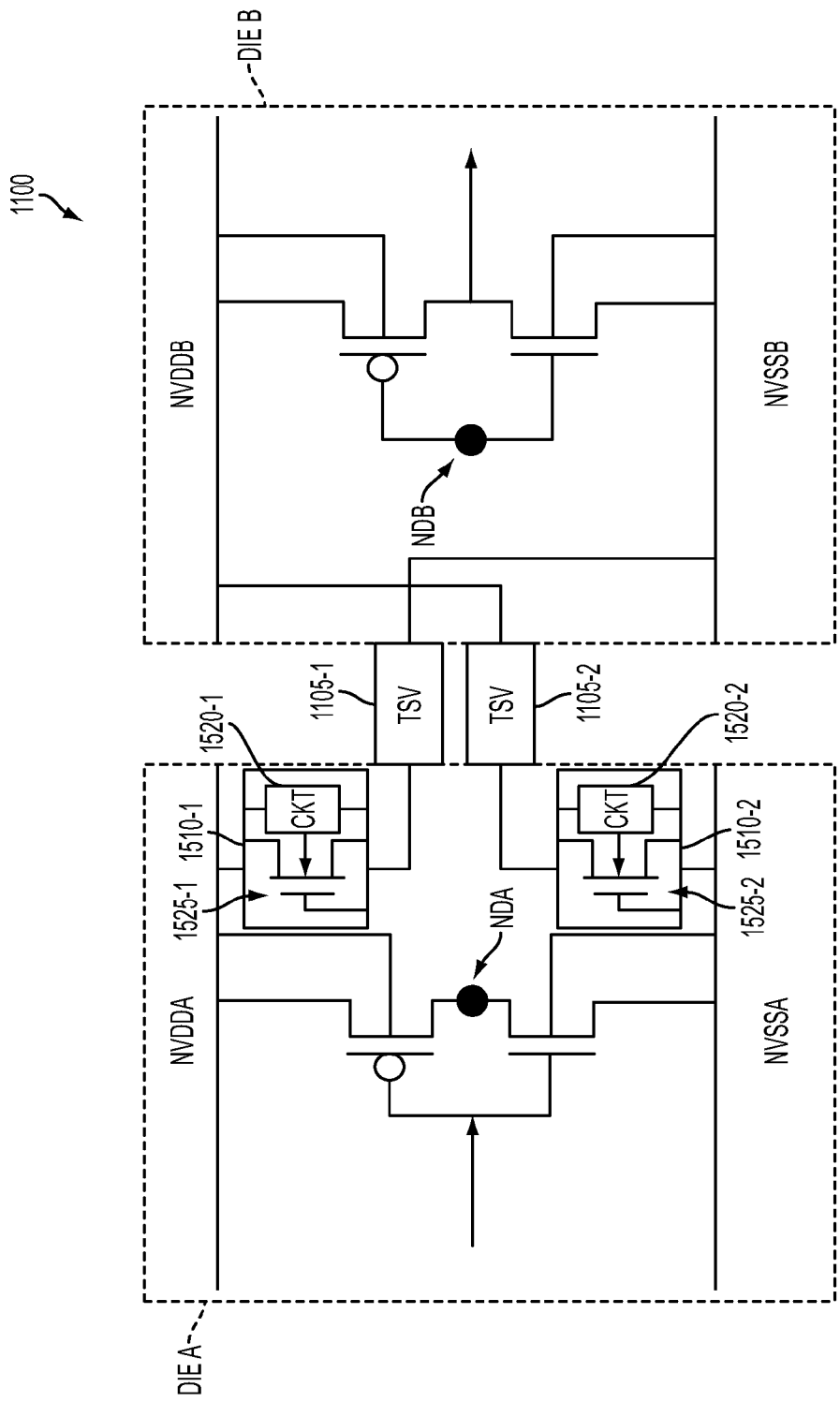
FIG. 15 is a diagram of the circuit in FIG. 11 having protection circuits implemented as NMOS transistors with another control circuit, in accordance with some embodiments.

FIG. 15 is a diagram of chip 1100 in which circuits 1110-1 and 1110-2 are implemented with circuits 1510-1 and 1510-2, respectively, in accordance with some embodiments.

Circuit 1510-1 includes an NMOS transistor 1525-1 having a bulk coupled to control circuit 1520-1 to turn on and off transistor 1525-1.

When transistor 1525-1 is off, transistor 1525-1 is electrically disconnected from node NVDDA. As a result, there is no leakage through transistor 1525-1. When transistor 1525-1 is on, however, transistor 1525-1 functions in a manner similar to NMOS transistor 1210-1. That is, NMOS transistor 1525-1 provides a first current path from node NVDDA, transistor 1525-1, and TSV 1105-1 to node NVSSB. Transistor 1525-1 also provides a second current path from node NVSSB, TSV 1105-1, and transistor 1525-1 to node NVDDA.

In various embodiments, in a normal operation of chip 1100, control circuit 1520-1 is configured to turn off transistor 1525-1. When an ESD event occurs, the ESD current and/or ESD voltage causes control circuit 1520-1 to turn on transistor 1525-1. In some embodiments, control circuit 1520-1 includes mechanisms known in the art to turn on and off transistor 1525-1 based on an ESD event. The mechanisms are not described in this document, but should be recognizable by persons of ordinary skill in the art.

Circuit 1510-2 includes an NMOS transistor 1525-2 having a bulk coupled to control circuit 1520-2 to turn on and off transistor 1525-2.

When transistor 1525-2 is off, transistor 1525-2 is electrically disconnected from node NVSSA. As a result, there is no leakage through transistor 1525-2. When transistor 1525-2 is on, however, transistor 1525-2 functions in a manner similar to NMOS transistor 1210-2. That is, NMOS transistor 1525-2 provides a first current path from node NVSSA, transistor 1525-2, and TSV 1105-2 to node NVDDB. Transistor 1525-2 also provides a second current path from node NVDDB, TSV 1105-2, and transistor 1525-2 to node NVSSA.

In various embodiments, in a normal operation of chip 1100, control circuit 1520-2 is configured to turn off transistor 1525-2. When an ESD event occurs, the ESD current and/or ESD voltage causes control circuit 1520-2 to turn on transistor 1525-2. In some embodiments, control circuit 1520-2 includes mechanisms known in the art to turn on and off transistor 1525-2 based on an ESD event. The mechanisms are not described in this document, but should be recognizable by persons of ordinary skill in the art.

In some embodiments, the mechanisms used in control circuits 1520 and 1420 are also used in circuits to turn on and off transistors 310-1 and 310-2 in FIG. 3, transistors 810-1 and 810-2 in FIG. 8, and transistors 1310-1 and 1310-2 in FIG. 13.

Embodiments of the disclosure are advantageous because protection circuits provide currents path for the ESD current to flow when an ESD event occurs. The chance for the ESD current to flow through other transistors in die A and die B is reduced. As a result, transistors in die A and die B are protected. For example, the ESD current may flow from node NDB through circuit 110-1 in FIG. 1 to node NVDDB, leaving little current to flow through the gate oxide of transistor NB. Effectively, the gate oxide of transistor NB and thus transistor NB are protected. Further, various protection circuits, such as PMOS transistors and NMOS transistors, are turned off during a normal operation of the chips. As a result, the protection circuits do not assert leakage current during the normal operation. Additionally, embodiments advantageously yield improvements in the 2.5D/3D integration process that comprises stacking two individual dies into one single chip. By nature of the individual die, each die may have a different type of electrical charge, resulting in a charge imbalance between the two dies. For example, during the 2.5/3D stacking process the substrate of a first die may have a positive charge and the substrate of a second die may have a negative charge or vice versa. As a result, an imbalance in the charge distribution may occur and cause an ESD event. Without the protection circuits, the ESD current from the ESD event can damage circuit elements in die A and/or die B, and thus lower the manufacturing yield for a chip. The protection circuits prevent the ESD current from damaging die A and or die B, and thus improve the manufacturing yield. Effectively, the ESD protection circuits serve as yield control circuits in the 2.5D/3D integration process.

In some embodiments, an ESD protection circuit is connected to at least one end of a corresponding TSV. For example, with reference to FIG. 1, a first end of TSV 105 on the die B side is coupled to a protection circuit 110-1 and/or 110-2. Alternatively or additionally, a second end of TSV 105 on the die A side is coupled to a protection circuit (not shown) in die A corresponding to circuit 110-1 and/or 110-2 in die B. With reference to FIG. 6, a first end of TSV 605-1 on the die B side is coupled to protection circuit 610-1. Alternatively and/or additionally, a second end of TSV 605-1 on the die A side is coupled to a protection circuit (not shown) in die A corresponding to circuit 610-1 in die B, etc.

EXEMPLARY METHOD

Figure 16:
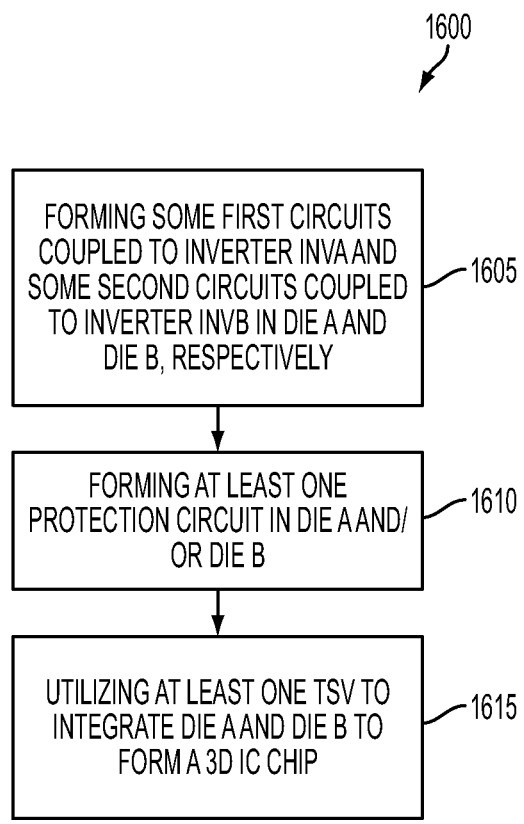
FIG. 16 is a flowchart illustrating a method of forming a 3D IC chip, in accordance with some embodiments.

FIG. 16 is a flowchart of a method 1600 illustrating forming a 3D IC chip, in accordance with some embodiments.

In step 1605, some first circuits coupled to the input of inverter INVA and some second circuits coupled to the output of inverter INVB are formed in die A and die B, respectively.

In step 1610, at least one protection circuit is formed in die A and/or die B. The at least one protection circuit is located at one or a plurality of locations illustratively explained above with reference to FIG. 1 to FIG. 15. A protection circuit is implemented by different circuit elements as explained above with reference to FIG. 1 to FIG. 15 as would be recognizable by persons of ordinary skill in the art after reviewing this document.

In step 1615, at least one TSV connect is used to integrate die A and die B to form a 3D IC chip, such as the 3D IC chips shown in FIGS. 1-15. In some embodiments, the TSVs are formed after the protection circuits are embedded in die A and/or die B in step 1610. The at least one TSV connects different nodes in die A and die B. For example, a first TSV connects node NDA and node NDB as illustratively shown in FIG. 1. A second TSV connects node NVDDA and node NVDDB, and a third TSV connects node NVSSA and NVSSB, as illustratively, shown in FIG. 6. A fourth TSV connects node NVDDA and node NVSSB, and a fifth TSV connects node NVSSA and node NVDDB, as illustratively shown in FIG. 12, etc.

Step 1615 indicating connections between die A and die B is for illustration. Different connections are within the scope of various embodiments as would be recognizable by persons of ordinary skill in the art after reviewing this document.

A number of embodiments have been described. It will nevertheless be understood that various modifications may be made without departing from the spirit and scope of the disclosure. For example, the various transistors being shown as a particular dopant type (e.g., N-type or P-type Metal Oxide Semiconductor (NMOS or PMOS)) are for illustration purposes. Embodiments of the disclosure are not limited to a particular type. Selecting different dopant types for a particular transistor is within the scope of various embodiments. The low or high logic level (e.g., Low or High) of the various signals used in the above description is also for illustration purposes. Various embodiments are not limited to a particular level when a signal is activated and/or deactivated. Selecting different levels is within the scope of various embodiments.

In some embodiment, a chip includes a first die, a second die, a plurality of interconnect structures, and at least one protection circuit. The first die has a first operational voltage node and a first reference voltage node. The second die has a second operational voltage node and a second reference voltage node. The plurality of interconnect structures is configured to connect the first die and the second die to form a 2.5D or a 3D integrated circuit. The at least one protection circuit is located at one or a combination of the following locations: a first location between the first operational voltage node and a first interconnect structure of the plurality of interconnect structures, the first interconnect structure being coupled to the second operational voltage node; a second location between the second operational voltage node and a second interconnect structure of the plurality of interconnect structures, the second interconnect structure being coupled to the first operational node; a third location between the first reference voltage node and a third interconnect structure of the plurality of interconnect structures, the third interconnect structure being coupled to the second reference voltage node; a fourth location between the second reference voltage node and a fourth interconnect structure of the plurality of interconnect structures, the fourth interconnect structure being coupled to the first reference voltage node; a fifth location between the first operational voltage node and a fifth interconnect structure of the plurality of interconnect structures, the fifth interconnect structure being coupled to the second reference voltage node; a sixth location between the second reference voltage node and a sixth interconnect structure of the plurality of interconnect structures, the sixth interconnect structure being coupled to the first operational voltage node; a seventh location between the first reference voltage node and an seventh interconnect structure of the plurality of interconnect structures, the seventh interconnect structure being coupled to the second operational voltage node; and an eighth location between the second operational voltage node and a eighth interconnect structure of the plurality of interconnect structures, the eighth interconnect structure being coupled to the first reference voltage node.

In some embodiments, a chip includes a first die, a second die, a first and a second through-silicon vias, a first protection circuit, and a second protection circuit. The first die has a first operational voltage node and a first reference voltage node. The second die has a second operational voltage node and a second reference voltage node. The first and the second through-silicon vias are configured to couple the first die and the second die. The first protection circuit is coupled between the first operational voltage node and the first through-silicon via. The second protection circuit is coupled between the first reference voltage node and the second through-silicon via. The first through-silicon via is further coupled to the second reference voltage node or the second operational voltage node. The second through-silicon via is further coupled to the first reference voltage node or the first operational voltage node.

In some embodiments, a method includes forming a first circuit in a first die and forming a second circuit in a second die. The first circuit includes a first operational voltage node and a first reference voltage node. The second circuit includes a second operational voltage node and a second reference voltage node. At least one protection circuit is formed in at least one of the first die and the second die. The first die and the second die are stacked to form a 2.5D or a 3D integrated circuit. The method further includes at least one of the following operations: forming a first through-silicon via, the first through-silicon via and a first protection circuit of the at least one protection circuit are between the first operational voltage node and the second operational voltage node; forming a second through-silicon via, the second through-silicon via and a second protection circuit of the at least one protection circuit are between the first reference voltage node and the second reference voltage node; forming a third through-silicon via, the third through-silicon via and a third protection circuit of the at least one protection circuit are between the first operational voltage node and the second reference voltage node; and forming a fourth through-silicon via, the fourth through-silicon via and a fourth protection circuit of the at least one protection circuit are between the first reference voltage node and the second operational voltage node.

The above methods show exemplary steps, but the steps are not necessarily performed in the order shown. Steps may be added, replaced, changed order, and/or eliminated as appropriate, in accordance with the spirit and scope of disclosed embodiments.

What is claimed is:

1. A chip comprising:
   a first die having a first operational voltage node and a first reference voltage node;
   a second die having a second operational voltage node and a second reference voltage node;
   a plurality of through-silicon vias (TSVs) between the first die and the second die and configured to connect the first die and the second die to form a 2.5D or a 3D integrated circuit;
   at least one protection circuit located at one or a combination of the following locations:
      a first location in the first die between the first operational voltage node and a first TSV of the plurality of TSVs, the first TSV being coupled to the second operational voltage node;
      a second location in the second die between the second operational voltage node and a second TSV of the plurality of TSVs, the second TSV being coupled to the first operational voltage node;
      a third location in the first die between the first reference voltage node and a third TSV of the plurality of TSVs, the third TSV being coupled to the second reference voltage node;
      a fourth location in the second die between the second reference voltage node and a fourth TSV of the plurality of TSVs, the fourth TSV being coupled to the first reference voltage node;
      a fifth location in the first die between the first operational voltage node and a fifth TSV of the plurality of TSVs, the fifth TSV being coupled to the second reference voltage node;
      a sixth location in the second die between the second reference voltage node and a sixth TSV of the plurality of TSVs, the sixth TSV being coupled to the first operational voltage node;
      a seventh location in the first die between the first reference voltage node and a seventh TSV of the plurality of TSVs, the seventh TSV being coupled to the second operational voltage node; or
      an eighth location in the second die between the second operational voltage node and an eighth TSV of the plurality of TSVs, the eighth TSV being coupled to the first reference voltage node.

2. The chip of claim 1, wherein
   the at least one protection circuit includes at least one pair of diodes, each pair of diodes of the at least one pair of diodes having a first diode, a second diode, a first pair node, and a second pair node, the first pair node coupling a first anode of the first diode and a second cathode of the second diode, the second pair node coupling a first cathode of the first diode and a second anode of the second diode;
   a first pair node of a first pair of diodes of the at least one pair of diodes is coupled to the first operational voltage node and a second pair node of the first pair of diodes is coupled to the first TSV, if the first pair of diodes is located at the first location;
   a first pair node of a second pair of diodes of the at least one pair of diodes is coupled to the second operational voltage node and a second pair node of the second pair of diodes is coupled to the second TSV, if the second pair of diodes is located at the second location;
   a first pair node of a third pair of diodes of the at least one pair of diodes is coupled to the first reference voltage node and a second pair node of the third pair of diodes is coupled to the third TSV, if the third pair of diodes is located at the third location; and
   a first pair node of a fourth pair of diodes of the at least one pair of diodes is coupled to the second reference voltage node and a second pair node of the fourth pair of diodes is coupled to the fourth TSV, if the fourth pair of diodes is located at the fourth location.

3. The chip of claim 1, wherein
   the at least one protection circuit includes at least one PMOS transistor and/or at least one NMOS transistor, each PMOS transistor of the at least one PMOS transistor has a drain as a first P end and a source coupled to a gate as a second P end, each NMOS transistor of the at least one NMOS transistor has a drain as a first N end and a source coupled to a gate as a second N end;
   a first PMOS transistor of the at least one PMOS transistor is coupled between the first operational voltage node and the first TSV via a first P end and a second P end of the first PMOS transistor, if the first PMOS transistor is located at the first location;
   a second PMOS transistor of the at least one PMOS transistor is coupled between the second operational voltage node and the second TSV via a first P end and a second P end of the second PMOS transistor, if the second PMOS transistor is located at the second location;
   a first NMOS transistor of the at least one NMOS transistor is coupled between the first reference voltage node and the third TSV via a first N end and a second N end of the first NMOS transistor, if the first NMOS transistor is located at the third location; and
   a second NMOS transistor of the at least one NMOS transistor is coupled between the second reference voltage node and the fourth TSV via a first N end and a second N end of the second NMOS transistor, if the second NMOS transistor is located at the fourth location.

4. The chip of claim 1, further comprising at least one control circuit configured to satisfy at least one of the following conditions:
   a first control circuit of the at least one control circuit is configured to control a gate of a first transistor at the fifth location;
   a second control circuit of the at least one control circuit is configured to control a gate of a second transistor at the sixth location;
   a third control circuit of the at least one control circuit is configured to control a gate of a third transistor at the seventh location;

a fourth control circuit of the at least one control circuit is configured to control a gate of a fourth transistor at the eighth location;
a fifth control circuit of the at least one control circuit is configured to control a bulk of a fifth transistor at the fifth location;
a sixth control circuit of the at least one control circuit is configured to control a bulk of a sixth transistor at the sixth location;
a seventh control circuit of the at least one control circuit is configured to control a bulk of a seventh transistor at the seventh location; or
an eighth control circuit of the at least one control circuit is configured to control a bulk of an eighth transistor at the eighth location.

5. The chip of claim 1, wherein
the at least one protection circuit includes at least one silicon controlled rectifier (SCR), each SCR of the at least one SCR including an anode and a cathode;
a first SCR of the at least one SCR is coupled between the first operational node and the first TSV via a first anode and a first cathode of the first SCR, if the first SCR is located at the first location;
a second SCR of the at least one SCR is coupled between the second operational node and the second TSV via a second anode and a second cathode of the second SCR, if the second SCR is located at the second location;
a third SCR of the at least one SCR is coupled between the first reference node and the third TSV via a third anode and a third cathode of the third SCR, if the third SCR is located at the third location; and
a fourth SCR of the at least one SCR is coupled between the second reference node and the fourth TSV via a fourth anode and a fourth cathode of the fourth SCR, if the fourth SCR is located at the fourth location.

6. The chip of claim 1, wherein
the at least one protection circuit includes at least one PNP bipolar transistor and/or at least one NPN bipolar transistor, each PNP bipolar transistor of the at least one PNP bipolar transistor having an emitter coupled to a base and configured as a first PNP end and a collector configured as a second PNP end, each NPN bipolar transistor of the at least one NPN bipolar transistor having an emitter coupled to a base and configured as a first NPN end and a collector configured as a second NPN end;
a first PNP bipolar transistor of the at least one PNP bipolar transistor is coupled between the first operational voltage node and the first TSV via a first PNP end and a second PNP end of the first PNP bipolar transistor, if the first PNP bipolar transistor is located at the first location;
a second PNP bipolar transistor of the at least one PNP bipolar transistor is coupled between the second operational voltage node and the second TSV via a first PNP end and a second PNP end of the second PNP bipolar transistor, if the second PNP bipolar transistor is located at the second location;
a first NPN bipolar transistor of the at least one NPN bipolar transistor is coupled between the first reference voltage node and the third TSV via a first NPN end and a second NPN end of the first NPN bipolar transistor, if the first NPN bipolar transistor is located at the third location; and
a second NPN bipolar transistor of the at least one NPN bipolar transistor is coupled between the second reference voltage node and the fourth TSV via a first NPN end and a second NPN end of the second NPN bipolar transistor, if the second NPN bipolar transistor is located at the fourth location.

7. The chip of claim 1, wherein
the at least one protection circuit includes at least one NMOS transistor and/or at least one PMOS transistor;
a first N drain of a first NMOS transistor of the at least one NMOS transistor is coupled to the first operational voltage node, a first N source and a first N gate of the first NMOS transistor are coupled to the fifth TSV, if the first NMOS transistor is located at the fifth location;
a second N drain of a second NMOS transistor of the at least one NMOS transistor is coupled to the sixth TSV, a second N source and a second N gate of the second NMOS transistor are coupled to the second reference voltage node, if the second NMOS transistor is located at the sixth location;
a third N drain of a third NMOS transistor of the at least one NMOS transistor is coupled to the seventh TSV, a third N source and a third N gate of the third NMOS transistor are coupled to the first reference voltage node, if the third NMOS transistor is located at the seventh location;
a fourth N drain of a fourth NMOS transistor of the at least one NMOS transistor is coupled to the second operational voltage node, a fourth N source and a fourth N gate of the fourth NMOS transistor are coupled to the eighth TSV, if the fourth NMOS transistor is located at the eighth location;
a first P drain of a first PMOS transistor of the at least one PMOS transistor is coupled to the fifth TSV, a first P source and a first P gate of the first PMOS transistor are coupled to the first operational voltage node, if the first PMOS transistor is located at the fifth location;
a second P drain of a second PMOS transistor of the at least one PMOS transistor is coupled to the second reference voltage node, a second P source and a second P gate of the second PMOS transistor are coupled to the sixth TSV, if the second PMOS transistor is located at the sixth location;
a third P drain of a third PMOS transistor of the at least one PMOS transistor is coupled to the first reference voltage node, a third P source and a third P gate of the third PMOS transistor are coupled to the seventh TSV, if the third PMOS transistor is located at the seventh location; and
a fourth P drain of a fourth PMOS transistor of the at least one PMOS transistor is coupled to the eighth TSV, a fourth P source and a fourth P gate of the fourth PMOS transistor are coupled to the second operational voltage node, if the fourth PMOS transistor is located at the eighth location.

8. The chip of claim 7, wherein the chip further comprises at least one control circuit configured to satisfy at least one of the following conditions:
a first control circuit of the of the at least one control circuit is configured to control the first N gate of the first NMOS transistor;
a second control circuit of the of the at least one control circuit is configured to control the second N gate of the second NMOS transistor;
a third control circuit of the of the at least one control circuit is configured to control the third N gate of the third NMOS transistor;
a fourth control circuit of the of the at least one control circuit is configured to control the fourth N gate of the fourth NMOS transistor;

a fifth control circuit of the of the at least one control circuit is configured to control a first N bulk of the first NMOS transistor;
a sixth control circuit of the of the at least one control circuit is configured to control a second N bulk of the second NMOS transistor;
a seventh control circuit of the of the at least one control circuit is configured to control a third N bulk of the third NMOS transistor;
an eighth control circuit of the of the at least one control circuit is configured to control a fourth N bulk of the fourth NMOS transistor;
a ninth control circuit of the of the at least one control circuit is configured to control the first P gate of the first PMOS transistor;
a tenth control circuit of the of the at least one control circuit is configured to control the second P gate of the second PMOS transistor;
an eleventh control circuit of the of the at least one control circuit is configured to control the third P gate of the third PMOS transistor;
a twelfth control circuit of the of the at least one control circuit is configured to control the fourth P gate of the fourth PMOS transistor;
a thirteenth control circuit of the of the at least one control circuit is configured to control a first P bulk of the first PMOS transistor;
a fourteenth control circuit of the of the at least one control circuit is configured to control a second P bulk of the second PMOS transistor;
a fifteenth control circuit of the of the at least one control circuit is configured to control a third P bulk of the third PMOS transistor; or
a sixteenth control circuit of the of the at least one control circuit is configured to control a fourth P bulk of the fourth PMOS transistor.

9. A chip comprising:
a first die having a first operational voltage node and a first reference voltage node;
a second die having a second operational voltage node and a second reference voltage node;
a first through-silicon via (TSV) and a second TSV, each of the first TSV and the second TSV being located between the first die and the second die and configured to couple the first die and the second die;
a first protection circuit in the first die or in the second die and coupled between the first operational voltage node and the first TSV; and
a second protection circuit in the first die or in the second die and coupled between the first reference voltage node and the second TSV,
wherein
the first TSV is further coupled to the second reference voltage node or the second operational voltage node; and
the second TSV is further coupled to the first reference voltage node or the first operational voltage node.

10. The chip of claim 9, wherein each of the first protection circuit and the second protection circuit comprises a first diode and a second diode, an anode of the first diode being coupled to a cathode of the second diode, and a cathode of the first diode being coupled to an anode of the second diode.

11. The chip of claim 9, wherein each of the first protection circuit and the second protection circuit comprises a diode-connected transistor.

12. The chip of claim 9, wherein each of the first protection circuit and the second protection circuit comprises a PNP bipolar transistor and an NPN bipolar transistor, an emitter of the PNP bipolar transistor being coupled to a collector of the NPN bipolar transistor, an emitter of the NPN bipolar transistor being coupled to a collector of the PNP bipolar transistor, a base of the PNP bipolar transistor being coupled to the collector of the NPN bipolar transistor, and a base of the NPN bipolar transistor being coupled to the collector of the PNP bipolar transistor.

13. The chip of claim 9, wherein each of the first protection circuit and the second protection circuit comprises a MOS transistor and a control circuit configured to control a gate of the MOS transistor.

14. The chip of claim 9, wherein each of the first protection circuit and the second protection circuit comprises a diode-connected transistor and a control circuit configured to control a bulk of the diode-connected transistor.

15. A method comprising:
forming a first circuit in a first die, the first circuit comprising a first operational voltage node and a first reference voltage node;
forming a second circuit in a second die, the second circuit comprising a second operational voltage node and a second reference voltage node;
forming at least one protection circuit in at least one of the first die or the second die; and
stacking the first die and the second die to form a 2.5D or a 3D integrated circuit,
wherein the method further comprises at least one of the following operations:
forming a first through-silicon via (TSV) between the first die and the second die, the first through-silicon via and a first protection circuit of the at least one protection circuit being coupled between the first operational voltage node and the second operational voltage node;
forming a second TSV between the first die and the second die, the second through-silicon via and a second protection circuit of the at least one protection circuit being coupled between the first reference voltage node and the second reference voltage node;
forming a third TSV between the first die and the second die, the third through-silicon via and a third protection circuit of the at least one protection circuit being coupled between the first operational voltage node and the second reference voltage node; or
forming a fourth TSV between the first die and the second die, the fourth through-silicon via and a fourth protection circuit of the at least one protection circuit being coupled between the first reference voltage node and the second operational voltage node.

16. The method of claim 15, wherein the forming the at least one protection circuit comprises forming a first diode and a second diode, an anode of the first diode being coupled to a cathode of the second diode, and a cathode of the first diode being coupled to an anode of the second diode.

17. The method of claim 15, wherein the forming the at least one protection circuit comprises forming a diode-connected transistor.

18. The method of claim 15, wherein the forming the at least one protection circuit comprises forming a PNP bipolar transistor and an NPN bipolar transistor, an emitter of the PNP bipolar transistor being coupled to a collector of the NPN bipolar transistor, an emitter of the NPN bipolar transistor being coupled to a collector of the PNP bipolar transistor, a base of the PNP bipolar transistor being coupled to the collector of the NPN bipolar transistor, and a base of the NPN bipolar transistor being coupled to the collector of the PNP bipolar transistor.

19. The method of claim 15, wherein the forming the at least one protection circuit comprises forming a MOS transistor and a control circuit configured to control a gate of the MOS transistor.

20. The method of claim 15, wherein the forming the at least one protection circuit comprises forming a diode-connected transistor and a control circuit configured to control a bulk of the diode-connected transistor.

\* \* \* \* \*